(12) United States Patent
Tsau et al.

(10) Patent No.: US 12,308,537 B2
(45) Date of Patent: May 20, 2025

(54) CONNECTOR

(71) Applicant: EZCONN CORPORATION, New Taipei (TW)

(72) Inventors: Chang-Jie Tsau, New Taipei (TW); Kai-Chih Wei, New Taipei (TW)

(73) Assignee: EZCONN CORPORATION, New Taipei (TW)

( * ) Notice: Subject to any disclaimer, the term of this patent is extended or adjusted under 35 U.S.C. 154(b) by 404 days.

(21) Appl. No.: 18/063,811

(22) Filed: Dec. 9, 2022

(65) Prior Publication Data

US 2023/0187854 A1    Jun. 15, 2023

Related U.S. Application Data

(60) Provisional application No. 63/288,040, filed on Dec. 10, 2021.

(51) Int. Cl.
| | |
|---|---|
| *H01R 24/00* | (2011.01) |
| *H01R 12/53* | (2011.01) |
| *H01R 24/50* | (2011.01) |
| *H01R 103/00* | (2006.01) |

(52) U.S. Cl.
CPC .............. *H01R 12/53* (2013.01); *H01R 24/50* (2013.01); *H01R 2103/00* (2013.01)

(58) Field of Classification Search
CPC .................................................... H01R 24/50
See application file for complete search history.

(56) References Cited

U.S. PATENT DOCUMENTS

| | | | | |
|---|---|---|---|---|
| 6,012,931 A | * | 1/2000 | Michaux | H01R 43/0263 439/79 |
| 6,932,616 B1 | * | 8/2005 | Swantner | H01R 24/50 439/63 |
| 7,534,146 B2 | * | 5/2009 | Chien | H01R 24/58 439/668 |
| 8,754,734 B2 | * | 6/2014 | Schaffer | H01F 27/29 336/208 |
| 9,960,542 B2 | * | 5/2018 | Holland | H01R 24/40 |
| 2012/0145450 A1 | * | 6/2012 | Lan | H05K 9/0026 174/384 |
| 2023/0187854 A1 | * | 6/2023 | Tsau | H01R 12/53 439/581 |

* cited by examiner

*Primary Examiner* — Phuong Chi Thi Nguyen
(74) *Attorney, Agent, or Firm* — RANKIN, HILL & CLARK LLP (57) ABSTRACT

A connector is provided in the present invention. The connector is suitable for being assembled on a circuit board, and the circuit board includes an upper surface and a lower surface, and the connector includes a body, a mandrel, at least three supporting rods and an elastic part. The body includes a head, a body and a tail, and the head and the tail are connected to opposite sides of the body. The mandrel is coaxially passed through the body and protrudes from the head. The at least three supporting rods are connected to the head. The elastic part is disposed on at least one of the at least three support rods. Wherein, when the connector is assembled on the circuit board, the at least three supporting rods are arranged parallel to the circuit board, at least one of the at least three supporting rods is located on the lower surface of the circuit board, and the mandrel is connected to the circuit board, and the head is supported against the circuit board.

20 Claims, 6 Drawing Sheets

CONNECTOR

RELATED APPLICATIONS

This application is a non-provisional of, claims the benefit and priority of provisional Application No. 63/288,040, filed Dec. 10, 2021, which is incorporated herein by reference in its entirety.

TECHNICAL FIELD

The present invention relates to a connector. More particularly, the invention relates to an edge mount coaxial cable connector, when the connector is set on the circuit board, it has stable support and is not prone to falling problems.

BACKGROUND

To face the advent of a highly information-based society, communication infrastructure is needed to transmit various kinds of information, such as voice, text, data, images, etc. The connector is an important component in the era of high-frequency transmission, especially when the object to be connected by the connector is a circuit board, if the assembly between the two is not stable enough, the connector will often be skewed, or even cause dropping. So that, how to maintain the electrical continuity of the connector is an important issue.

Figure 1A:
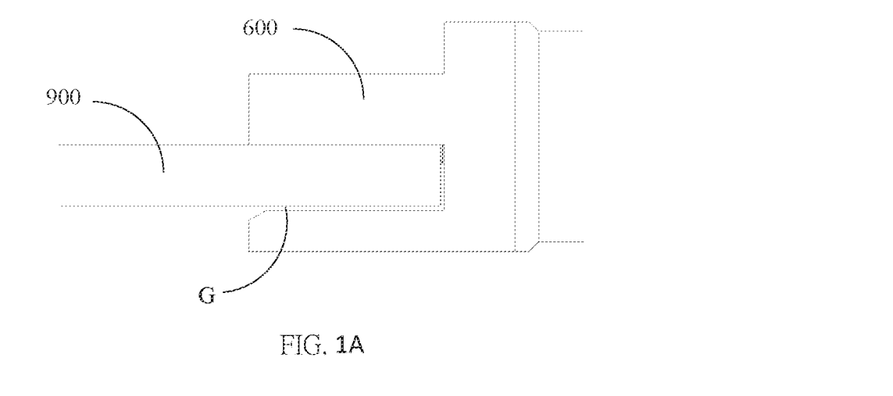
FIG. 1A is a schematic cross-sectional view of a prior art connector joined to a circuit board

In an prior art, please refer to FIG. 1A, when the connector 700 is to be connected to the circuit board 900, due to the problem of the production process, there is a tolerance between the two, so there will be a gap G between the connector 700 and the circuit board 900.

Figure 1B:
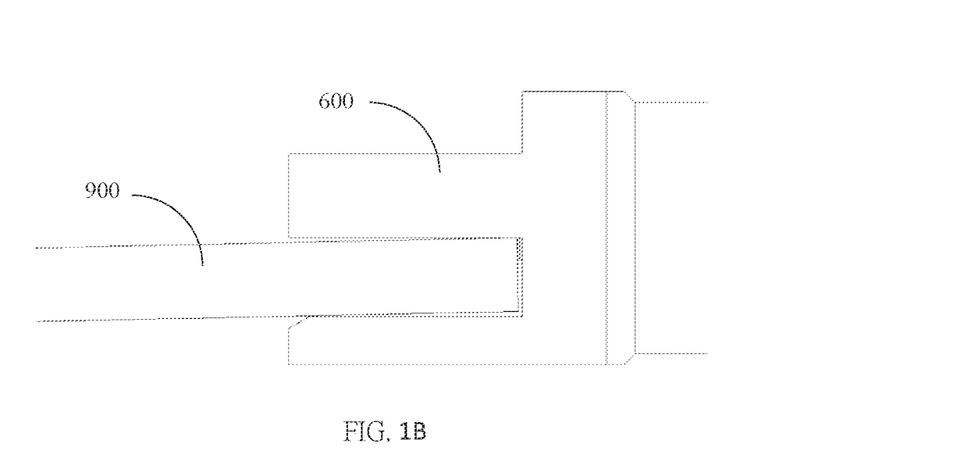
FIG. 1B is another schematic cross-sectional view of a prior art connector joined to a circuit board.

When there is a gap between the connector and the circuit board, the problem of inclination will occur. Please refer to FIG. 1B. When there is a gap between the circuit board and the connector, the following situations often occur: 1. The circuit board is inclined. 2. The connector cannot be fixed on the circuit board. 3. The connector is detached from the circuit board. No matter which of the above situations occurs, the signal between the circuit board and the connector cannot be transmitted. At this time, additional tools will be required to fix the circuit board and connectors to avoid the above problems.

However, the additional use of tools for fixing will cause an increase in operating time and an increase in the cost of money required. There is still a possibility of detachment between the connector and the board.

Therefore, how to improve the aforementioned problems to provide products that are more in line with market demand has become an important problem that this creation is eager to solve here.

SUMMARY

Therefore, the purpose of the present invention is to provide a connector that can improve at least one shortcoming of the prior art.

The present invention provides a connector. The connector suitable for assembly on a circuit board, and the circuit board includes an upper surface and a lower surface, the connector includes a body, a mandrel and an elastic part. The body comprising a head, a body and a tail, the head and the tail connecting opposite sides of the body. The mandrel coaxially penetrates the body and protrudes from the head. At least three supporting rods connecting the head. The elastic part arranged on at least one of the at least three supporting rods. Wherein, when the connector is assembled on the circuit board, the at least three supporting rods are arranged parallel to the circuit board, at least one of the at least three supporting rods is located on the lower surface of the circuit board, and the mandrel connected to the circuit board, and the head is supported against the circuit board.

In some embodiments, wherein the body and the at least three supporting rods are integrally formed.

In some embodiments, wherein the at least three supporting rods and the elastic part are integrally formed.

In some embodiments, wherein the at least three supporting rods and the elastic part are not integrally formed.

In some embodiments, wherein the mandrel is arranged parallel to the at least three supporting rods.

In some embodiments, wherein the at least three supporting rods include a supporting rod head, a supporting rod body and a supporting rod tail, and the supporting rod body is connected to the supporting rod head and the end of the supporting rod.

In some embodiments, wherein the at least three supporting rods include a supporting rod head, a supporting rod body and a supporting rod tail, and the supporting rod body is connected to the supporting rod head part and the tail of the supporting rod, and the head of the supporting rod is connected to the head of the body, the body of the supporting rod is at least partially attached to the circuit board, and the tail of the supporting rod extends from the body toward the circuit board direction.

In some embodiments, wherein the at least three supporting rods include a supporting rod head, a supporting rod body and a supporting rod tail, and the supporting rod body is connected to the supporting rod head part and the tail part of the supporting rod, the at least one elastic part is arranged on the body part of the supporting rod.

In some embodiments, wherein the at least three supporting rods include a supporting rod head, a supporting rod body and a supporting rod tail, and the supporting rod body is connected to the supporting rod head part and the tail part of the supporting rod, the at least one elastic part is arranged on the body part of the supporting rod, and the at least one elastic part is arranged facing the circuit board.

In some embodiments, wherein the at least three supporting rods include a supporting rod head, a supporting rod body and a supporting rod tail, and the supporting rod body is connected to the supporting rod head part and the tail part of the supporting rod, the at least one elastic part is located at least one of the head part of the supporting rod and the body part of the supporting rod.

In some embodiments, wherein the at least three supporting rods include a supporting rod head, a supporting rod body and a supporting rod tail, and the supporting rod body is connected to the supporting rod head part and the tail part of the supporting rod, the at least one elastic part is located at least one of the head part of the supporting rod and the body part of the supporting rod, and the at least one elastic part is arranged facing the circuit board.

In some embodiments, wherein the elastic part has a concave part and a convex part, the concave part corresponds to the convex part, and the convex part is disposed facing the circuit board.

In some embodiments, wherein the elastic part has a concave part and a convex part, the concave part corresponds to the convex part, and the convex part is provided facing the circuit board, when the connector is assembled on the circuit board, the convex part is deformed toward the direction of the concave part.

In some embodiments, wherein the elastic part has a concave part and a convex part, the concave part corresponds to the convex part, and the convex part is provided facing the circuit board, when the connector is assembled on the circuit board, the convex part is deformed toward the concave part, so that the at least three supporting rods are at least partially attached to the circuit board.

In some embodiments, wherein the elastic part has a concave part and a convex part, the concave part corresponds to the convex part, and the convex part is provided facing the circuit board, when the connector is assembled on the circuit board, the convex part is deformed toward the concave part, so that the at least three supporting rods are completely attached to the circuit board.

In some embodiments, wherein the at least three supporting rods pass through the at least one elastic part to closely fit the circuit board.

In some embodiments, wherein when the connector is assembled on the circuit board, the at least three supporting rods are arranged parallel to the circuit board and at least partially attached to the circuit board.

In some embodiments, wherein when the connector is assembled on the circuit board, the at least three supporting rods are arranged parallel to the circuit board, and when the connector is connected to the circuit board, the at least three supporting rods do not deform.

In some embodiments, wherein at least two of the at least three supporting rods are identical in size.

In some embodiments, wherein when the number of the at least one elastic part is greater than one, the elastic parts are evenly distributed on at least one of the at least three supporting rods.

Accordingly, the present invention provides a connector, which utilizes the design of the supporting rod and the elastic part, so that the connector can be firmly connected to the circuit board, and because the supporting rod itself does not produce deformation, it greatly reduces the time required for assembly. During the process, problems such as extrusion of the circuit board or loss of parts occur.

These and other components, steps, features, benefits and advantages of the present invention will now become apparent through a review of the following detailed description of the illustrative embodiments, the accompanying drawings and the claims.

BRIEF DESCRIPTION OF THE DRAWINGS

Unless specified otherwise, the accompanying drawings illustrate aspects of the innovative subject matter described herein. Referring to the drawings, wherein like reference numerals indicate similar parts throughout the several views, several examples of heatsink fins incorporating aspects of the presently disclosed principles are illustrated by way of example, and not by way of limitation.

DETAILED DESCRIPTION

Unless specified otherwise, the accompanying drawings illustrate aspects of the innovative subject matter described herein. Referring to the drawings, wherein like reference numerals indicate similar parts throughout the several views, several examples of connector incorporating aspects of the presently disclosed principles are illustrated by way of example, and not by way of limitation.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

Figure 2A:
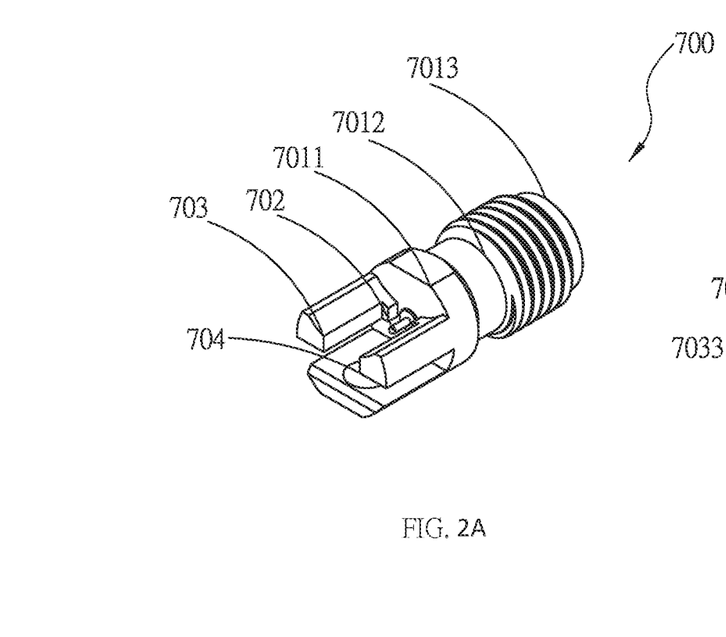
FIG. 2 depicts a connector according to various embodiments of this invention.
Figure 3A:
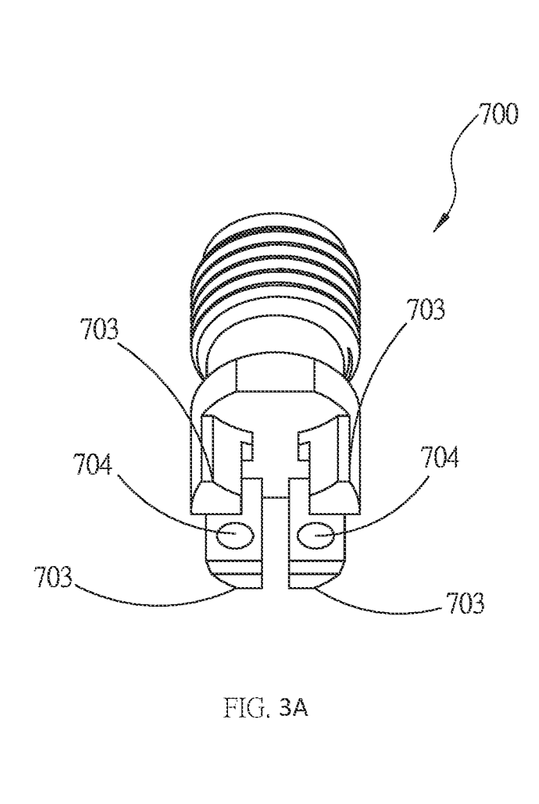
FIG. 3A depicts a connector according to various embodiments of this invention.
Figure 3B:
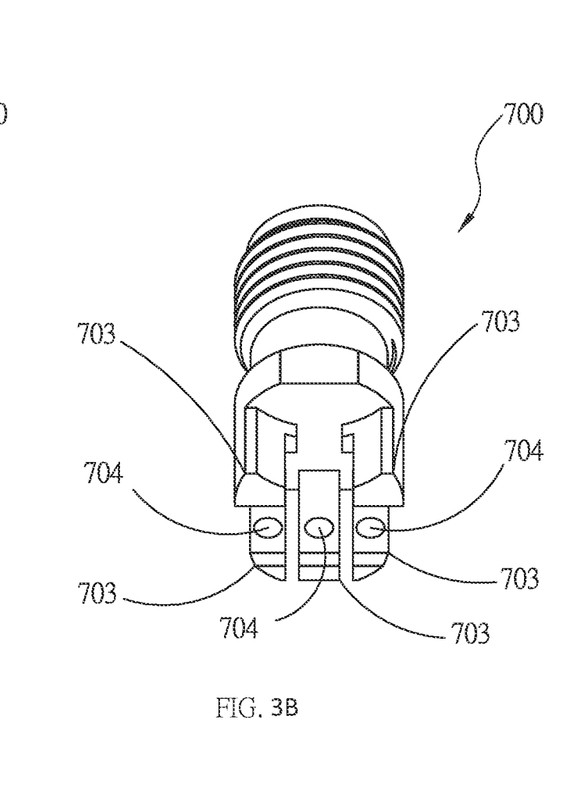
FIG. 3B depicts a connector according to various embodiments of this invention.
Figure 4A:
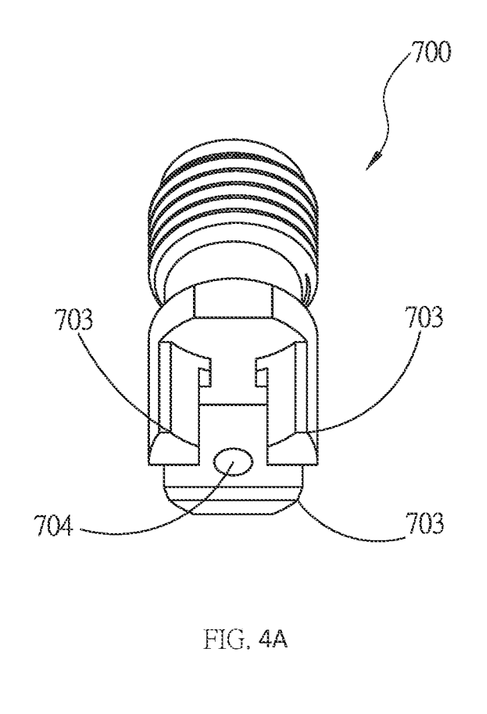
FIG. 4A depicts a connector according to various embodiments of this invention.
Figures 4B, 4C:
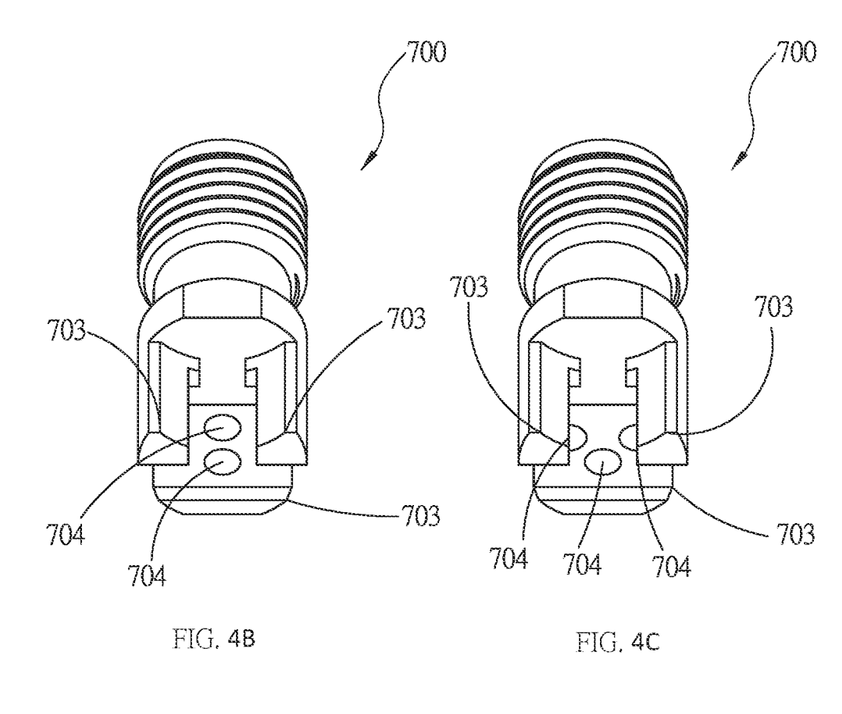
FIG. 4B depicts a connector according to various embodiments of this invention.
FIG. 4C depicts a connector according to various embodiments of this invention.
Figure 5:
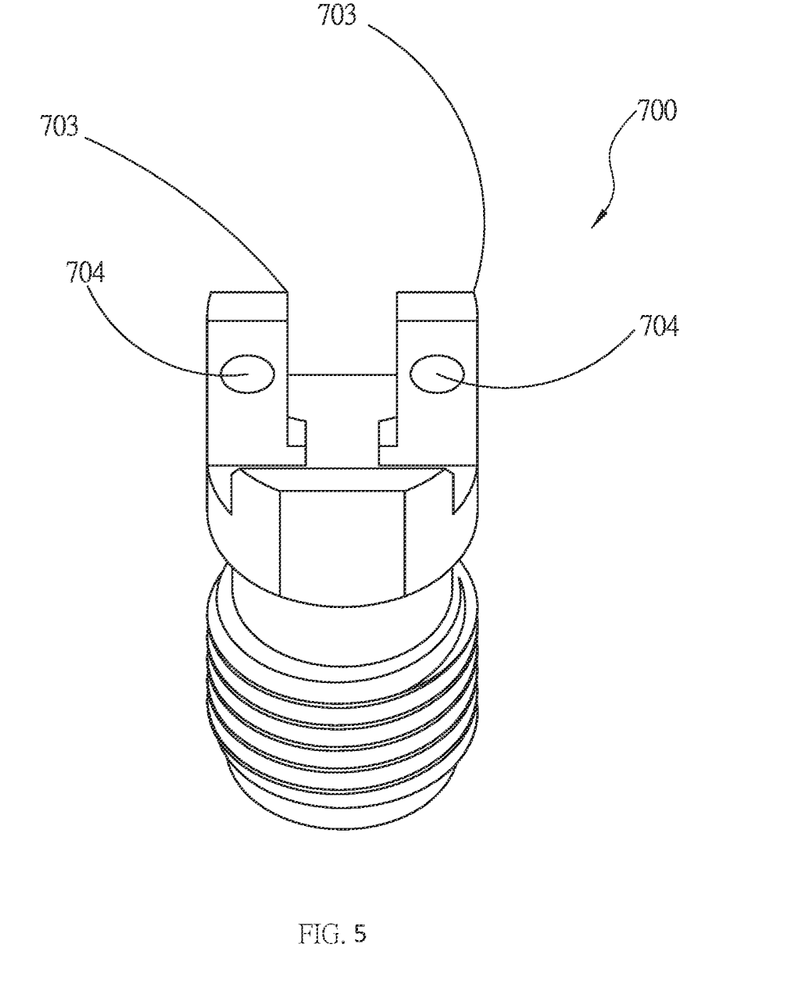
FIG. 5 depicts a connector according to various embodiments of this invention.
Figure 6A:
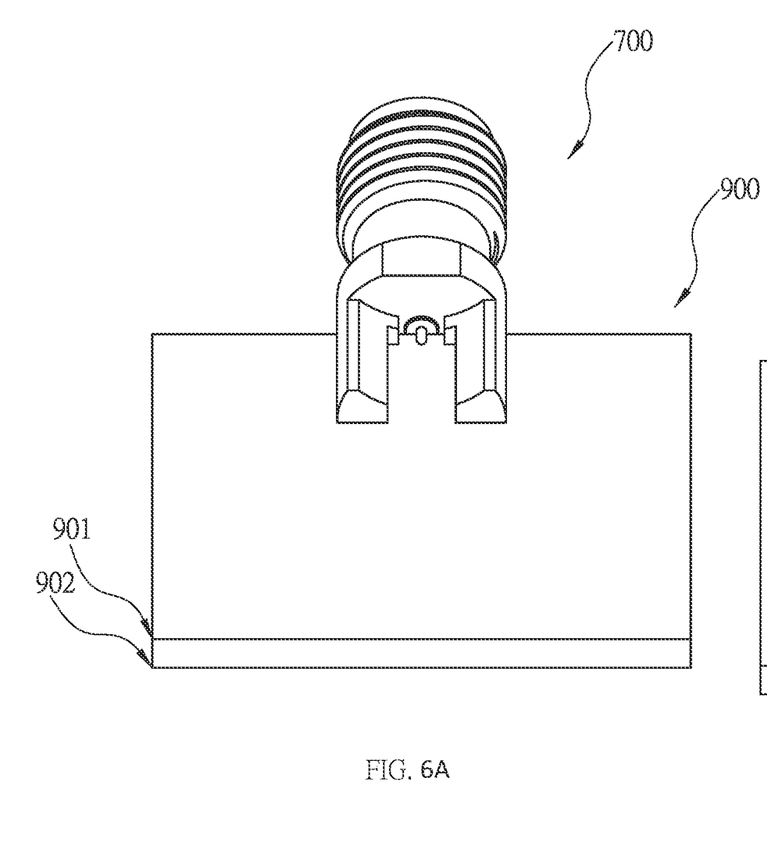
FIG. 6A depicts a connector according to various embodiments of this invention.
Figure 6B:
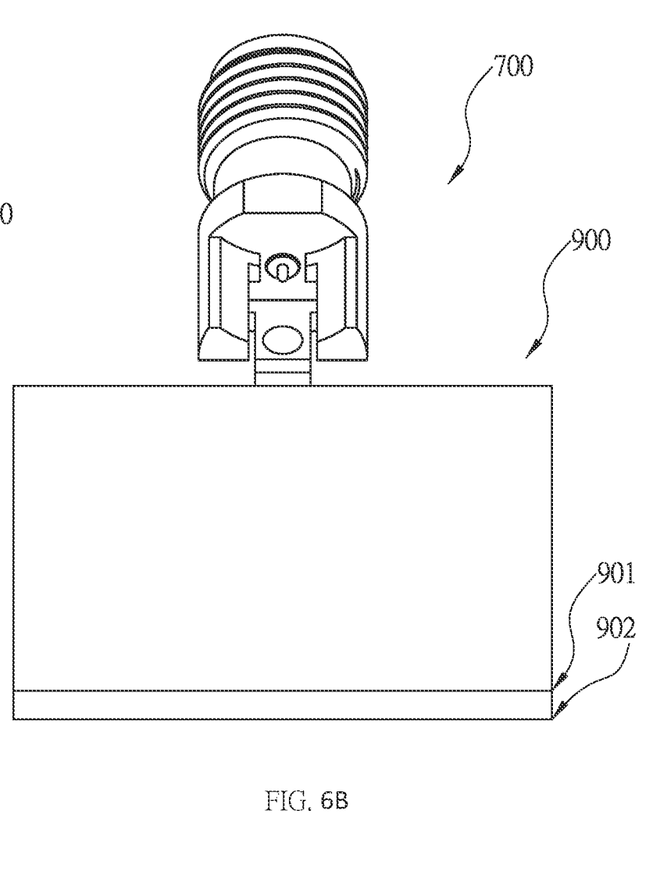
FIG. 6B depicts a connector according to various embodiments of this invention.

The present invention will now be described by referencing the appended figures representing preferred embodiments. FIG. 2 depicts a connector according to various embodiments of this invention. FIG. 3A depicts a connector according to various embodiments of this invention. FIG. 3B depicts a connector according to various embodiments of this invention. FIG. 4A depicts a connector according to various embodiments of this invention. FIG. 4B depicts a connector according to various embodiments of this invention. FIG. 4C depicts a connector according to various embodiments of this invention. FIG. 5 depicts a connector according to various embodiments of this invention. FIG. 6A depicts a connector according to various embodiments of this invention. FIG. 6B depicts a connector according to various embodiments of this invention.

The connector is suitable for assembly on a circuit board 900, and the circuit board 900 includes an upper surface 901 and a lower surface 902. The connector 700 includes a body 701, a mandrel 702, at least three supporting rods 703 and an elastic part 704. Regarding the connector 700 itself, the body 701 and the supporting rod 703 are integrally formed, and the materials are the same. The body 701 includes a head 7011, a body 7012 and a tail 7013, the head 7011 and the tail 7013 are connected to opposite sides of the body 7012. The mandrel 702 is coaxially passed through the body 701 and protrudes from the head 7011. At least three supporting rods 703 are connected to the head 7011. The elastic part 704 is disposed on at least one of the at least three supporting rods 703. In other words, from a structural point of view, the supporting rod 703 protrudes from the head 7011. Wherein, when the connector 700 is assembled on the circuit board 900, at least three supporting rods 703 are arranged parallel to the circuit board 900, at least one of the at least three supporting rods 703 is located on the lower surface 902 of the circuit board 900, and the mandrel 702 is connected to the circuit board 900, and the head 7011 is supported on the circuit board 900. In other words, the supporting rod 703 is parallel to the direction of the protruding mandrel 702, and when the connector 700 is assembled on the circuit board 900, the orthographic area of the supporting rod 703 falls completely within the range of the orthographic area of the circuit board 900, as shown in FIG. 6A and FIG. 6B. FIG. 6A is a schematic diagram of the connector 700 fully assembled on the circuit board 900, and FIG. 6B is a schematic diagram before assembly.

In an embodiment of the present invention, the number and position of the supporting rods 703 change with the demand, as shown in FIG. 3A and FIG. 3B, the number of supporting rods 703 can be 4 or 5, and their distribution positions affected by the placement position and angle of the circuit board 900. In other words, the number and position of the supporting rods 703 can be adjusted according to the needs of use. However, in this embodiment, the number and positions of the supporting rods 703 are only for illustration. However, the embodiments are not limited thereto. Other mechanisms and configurations may be employed by those of ordinary skill in the relevant art for supporting the connector and the circuit board together.

In addition, in an embodiment of the present creation, the quantity and position of the elastic part 704 are changed as required, as shown in FIG. 4A, FIG. 4B and FIG. 4C, the quantity of the elastic part 704 can be 1 or 2 or 3, and the distribution position is affected by the placement position and angle of the circuit board 900. Furthermore, in an embodiment of the present invention, a schematic view of the elastic part 704 on different supporting rods 703 is further shown. Please refer to FIG. 5, the elastic part 704 can be further disposed on different supporting rods 703. In other words, the number and position of the elastic parts 704 can be adjusted according to different usage requirements. In this embodiment, the number and positions of the elastic parts 704 are only for illustration.

Regarding the relationship between the elastic part 704 and the supporting rod 703, in an embodiment of the present invention, the supporting rod 703 and the elastic part 704 are integrally formed, that is to say, the supporting rod 703 and the elastic part 704 are can be made of the same material. However, in another embodiment of the present invention, the supporting rod 703 and the elastic part 704 may not be integrally formed. In other words, the materials of the supporting rod 703 and the elastic part 704 may be different.

Figure 2B:
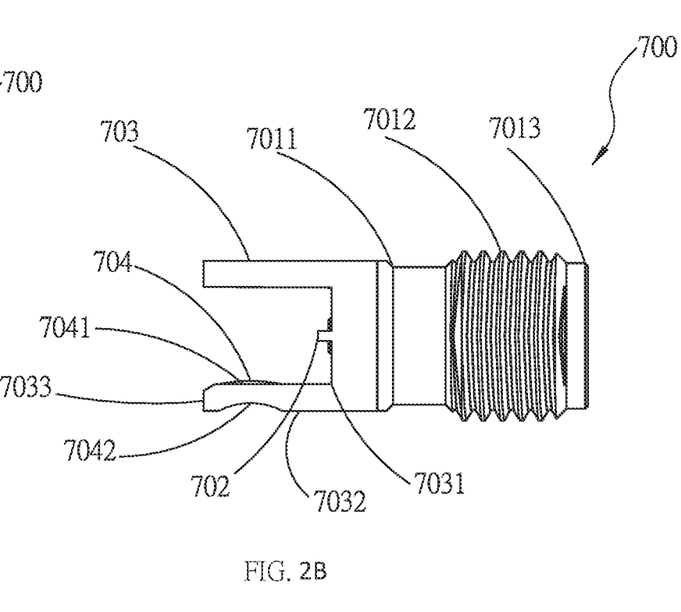

In an embodiment of this creation, please refer to FIG. 2B, wherein the supporting rod 703 includes a supporting rod head 7031, a supporting rod body 7032 and a supporting rod tail 7033, and the supporting rod body 7032 is connected to the supporting rod head part 7031 and supporting rod tail part 7033, and the supporting rod head 7031 is connected to the head 7011 of the body 701, the supporting rod body part 7032 is at least partially attached to the circuit board 900, and the supporting rod tail part 7033 is from the body 701 towards the circuit board 900 direction extension. In other words, along the direction of the body 701 of the connector 700 toward the circuit board 900, there are the supporting rod head 7031, the supporting rod body 7032 and the supporting rod tail 7033 in sequence.

In an embodiment of the present creation, the elastic part 704 is disposed on the support shaft portion 7032, and the elastic part 704 is disposed facing the circuit board 900. In another embodiment of the present invention, the elastic part 704 is located in at least one of the supporting rod head 7031 and the support shaft portion 7032, and when the number of elastic parts 704 is greater than one, the elastic parts 704 are evenly distributed in on at least one of the supporting rods 703. In other words, as mentioned above, the distribution position of the elastic part 704 on the supporting rod 703 is determined according to the demand. However, regardless of the number and distribution position of the elastic part 704, the elastic part 704 is arranged on the supporting rod 703 facing the circuit. On the side of the board 900, that is, when the connector 700 is assembled on the circuit board 900, the elastic part 704 is located between the circuit board 900 and the support bar 703.

In an embodiment of the present invention, the elastic part 704 has a convex part 7041 and a concave part 7042, the convex part 7041 corresponds to the concave part 7042, and the concave part 7042 is disposed facing the circuit board 900. When the connector 700 is assembled on the circuit board 900, the convex part 7041 is deformed toward the direction of the concave part 7042, so that the three support bars 703 are at least partially attached to the circuit board 900. Moreover, in another embodiment of the present invention, when the connector 700 is assembled on the circuit board 900, the convex part 7041 is deformed toward the concave part 7042 and the convex part 7041, so that the three supporting rods 703 are completely attached to the circuit board 900. In other words, when the connector 700 is assembled on the circuit board 900, through the elasticity of the elastic part 704 itself, the gap between the circuit board 900 and the supporting rods 703 will be reduced, and even after the assembly is completed, due to the deformation of the elastic part 704, the supporting rods 703 can closely fit the circuit board 900 through the elastic part 704.

The above is to describe the assembly process. After the assembly is completed, the supporting rod 703 is parallel to the circuit board 900, and at least partially attached to the circuit board 900, so that the connector 700 is not easy to fall off the circuit board 900, and when the connector 700 is on the circuit board 900, the supporting rod 703 itself does not deform.

As far as the size of the supporting rod 703 is concerned, at least two of the supporting rods 703 are identical in size.

In summary, this invention proposes a connector, which has at least the following advantages:

1. Through the design of the supporting rod and the elastic part, the connector can be firmly installed on the circuit board. So that when the connector needs to be soldered on the circuit board later, the connector will not fall off due to vibration, movement, etc. during the soldering process, which greatly improves the convenience of soldering.

2. When the connector is assembled on the circuit board, since the supporting rod itself does not produce deformation, problems such as extrusion of the circuit board or loss of parts during the assembly process are greatly reduced.

3. When the connector is assembled on the circuit board, since the support rod and the circuit board are partially tightly fitted, the volume occupied by the outside is greatly reduced, making the use of space more flexible.

The presently disclosed inventive concepts are not intended to be limited to the embodiments shown herein, but are to be accorded their full scope consistent with the principles underlying the disclosed concepts herein. Directions and references to an element, such as "up," "down,", "upper," "lower," "horizontal," "vertical," "left," "right," and the like, do not imply absolute relationships, positions, and/or orientations. Terms of an element, such as "first" and "second" are not literal, but, distinguishing terms. As used herein, terms "comprises" or "comprising" encompass the notions of "including" and "having" and specify the presence of elements, operations, and/or groups or combinations thereof and do not imply preclusion of the presence or addition of one or more other elements, operations and/or groups or combinations thereof. Sequence of operations do not imply absoluteness unless specifically so stated. Reference to an element in the singular, such as by use of the article "a" or "an", is not intended to mean "one and only one" unless specifically so stated, but rather "one or more". As used herein, "and/or" means "and" or "or", as well as "and" and "or." As used herein, ranges and subranges mean all ranges including whole and/or fractional values therein and language which defines or modifies ranges and subranges, such as "at least," "greater than," "less than," "no more than," and the like, mean subranges and/or an upper or lower limit. All structural and functional equivalents to the elements of the various embodiments described throughout the disclosure that are known or later come to be known to those of ordinary skill in the relevant art are intended to be encompassed by the features described and claimed herein. Moreover, nothing disclosed herein is intended to be dedicated to the public regardless of whether such disclosure may ultimately explicitly be recited in the claims. No element or concept disclosed herein or hereafter presented shall be construed under the provisions of 35 USC 112(f) unless the element or concept is expressly recited using the phrase "means for" or "step for".

In view of the many possible embodiments to which the disclosed principles can be applied, we reserve the right to claim any and all combinations of features and acts described herein, including the right to claim all that comes within the scope and spirit of the foregoing description, as well as the combinations recited, literally and equivalently, in the following claims and any claims presented anytime throughout prosecution of this application or any application claiming benefit of or priority from this application.

What is claimed is:

1. A connector suitable for assembly on a circuit board, and the circuit board includes an upper surface and a lower surface, the connector includes:
   a body comprising a head, a body and a tail, the head and the tail connecting opposite sides of the body;
   a mandrel, coaxially penetrates the body and protrudes from the head;
   at least three supporting rods connecting the head; and
   an elastic part, arranged on at least one of the at least three supporting rods;
Wherein, when the connector is assembled on the circuit board, the at least three supporting rods are arranged parallel to the circuit board, at least one of the at least three supporting rods is located on the lower surface of the circuit board, and the mandrel connected to the circuit board, and the head is supported against the circuit board.

2. The connector according to claim 1, wherein the body and the at least three supporting rods are integrally formed.

3. The connector according to claim 1, wherein the at least three supporting rods and the elastic part are integrally formed.

4. The connector according to claim 1, wherein the at least three supporting rods and the elastic part are not integrally formed.

5. The connector according to claim 1, wherein the mandrel is arranged parallel to the at least three supporting rods.

6. The connector according to claim 1, wherein the at least three supporting rods include a supporting rod head, a supporting rod body and a supporting rod tail, and the supporting rod body is connected to the supporting rod head and the end of the supporting rod.

7. The connector according to claim 1, wherein the at least three supporting rods include a supporting rod head, a supporting rod body and a supporting rod tail, and the supporting rod body is connected to the supporting rod head part and the tail of the supporting rod, and the head of the supporting rod is connected to the head of the body, the body of the supporting rod is at least partially attached to the circuit board, and the tail of the supporting rod extends from the body toward the circuit board direction.

8. The connector according to claim 1, wherein the at least three supporting rods include a supporting rod head, a supporting rod body and a supporting rod tail, and the supporting rod body is connected to the supporting rod head part and the tail part of the supporting rod, the at least one elastic part is arranged on the body part of the supporting rod.

9. The connector according to claim 1, wherein the at least three supporting rods include a supporting rod head, a supporting rod body and a supporting rod tail, and the supporting rod body is connected to the supporting rod head part and the tail part of the supporting rod, the at least one elastic part is arranged on the body part of the supporting rod, and the at least one elastic part is arranged facing the circuit board.

10. The connector according to claim 1, wherein the at least three supporting rods include a supporting rod head, a supporting rod body and a supporting rod tail, and the supporting rod body is connected to the supporting rod head part and the tail part of the supporting rod, the at least one elastic part is located at least one of the head part of the supporting rod and the body part of the supporting rod.

11. The connector according to claim 1, wherein the at least three supporting rods include a supporting rod head, a supporting rod body and a supporting rod tail, and the supporting rod body is connected to the supporting rod head part and the tail part of the supporting rod, the at least one elastic part is located at least one of the head part of the supporting rod and the body part of the supporting rod, and the at least one elastic part is arranged facing the circuit board.

12. The connector according to claim 1, wherein the elastic part has a concave part and a convex part, the concave part corresponds to the convex part, and the convex part is disposed facing the circuit board.

13. The connector according to claim 1, wherein the elastic part has a concave part and a convex part, the concave part corresponds to the convex part, and the convex part is provided facing the circuit board, when the connector is assembled on the circuit board, the convex part is deformed toward the direction of the concave part.

14. The connector as claimed in claim 1, wherein the elastic part has a concave part and a convex part, the concave part corresponds to the convex part, and the convex part is provided facing the circuit board, when the connector is assembled on the circuit board, the convex part is deformed toward the concave part, so that the at least three supporting rods are at least partially attached to the circuit board.

15. The connector according to claim 1, wherein the elastic part has a concave part and a convex part, the concave part corresponds to the convex part, and the convex part is provided facing the circuit board, when the connector is assembled on the circuit board, the convex part is deformed toward the concave part, so that the at least three supporting rods are completely attached to the circuit board.

16. The connector according to claim 1, wherein the at least three supporting rods pass through the at least one elastic part to closely fit the circuit board.

17. The connector according to claim 1, wherein when the connector is assembled on the circuit board, the at least three supporting rods are arranged parallel to the circuit board and at least partially attached to the circuit board.

18. The connector as claimed in claim 1, wherein when the connector is assembled on the circuit board, the at least three supporting rods are arranged parallel to the circuit board, and when the connector is connected to the circuit board, the at least three supporting rods do not deform.

19. The connector according to claim 1, wherein at least two of the at least three supporting rods are identical in size.

20. The connector according to claim 1, wherein when the number of the at least one elastic part is greater than one, the elastic parts are evenly distributed on at least one of the at least three supporting rods.

* * * * *